US006867991B1

(12) United States Patent
Tezcan et al.

(10) Patent No.: US 6,867,991 B1
(45) Date of Patent: Mar. 15, 2005

(54) CONTENT ADDRESSABLE MEMORY DEVICES WITH VIRTUAL PARTITIONING AND METHODS OF OPERATING THE SAME

(75) Inventors: Bertan Tezcan, Mountain View, CA (US); Michael Miller, Saratoga, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 18 days.

(21) Appl. No.: 10/613,245

(22) Filed: Jul. 3, 2003

(51) Int. Cl.[7] .............................................. G11C 15/00
(52) U.S. Cl. ................ 365/49; 365/230.03; 365/189.07
(58) Field of Search .............................. 365/49, 230.03, 365/230.06, 189.07, 189.08, 189.12

(56) References Cited

U.S. PATENT DOCUMENTS 5,386,413 A 1/1995 McAuley et al.
5,446,685 A 8/1995 Holst
5,497,404 A 3/1996 Grover et al.
5,502,832 A * 3/1996 Ali-Yahia et al. ........... 711/108
5,517,441 A 5/1996 Dietz et al.
5,598,115 A 1/1997 Holst
5,852,569 A * 12/1998 Srinivasan et al. ........... 365/49
5,898,689 A 4/1999 Kumar et al.
5,917,821 A 6/1999 Gobuyan et al.
5,940,392 A 8/1999 Lo et al.
5,940,597 A 8/1999 Chung
6,052,683 A 4/2000 Irwin
6,101,115 A 8/2000 Ross
6,125,049 A 9/2000 Nataraj
6,147,891 A 11/2000 Nataraj
6,166,939 A 12/2000 Nataraj et al.
6,191,969 B1 2/2001 Pereira
6,191,970 B1 2/2001 Pereira
6,236,658 B1 5/2001 Essbaum et al.
6,237,079 B1 5/2001 Stoney
6,240,001 B1 5/2001 Ross
6,243,280 B1 6/2001 Wong et al.
6,252,872 B1 6/2001 Tzeng
6,262,929 B1 7/2001 Miyatake et al.
6,324,087 B1 11/2001 Pereira
6,331,985 B1 12/2001 Coden
6,343,029 B1 1/2002 Kengeri et al.
6,356,951 B1 3/2002 Gentry, Jr.
6,370,613 B1 4/2002 Diede et al.
6,389,468 B1 5/2002 Muller et al.

(List continued on next page.)

OTHER PUBLICATIONS

Zane et al., "CoolCAMs: Power–Efficient TCAMs for Forwarding Engines," IEEE INFOCOM 2003, 22 pages.

*Primary Examiner*—Anh Phung
*Assistant Examiner*—Dang T Nguyen
(74) *Attorney, Agent, or Firm*—Myers Bigel Sibley & Sajovec

(57) ABSTRACT

CAM devices and methods of operating CAM devices include mapping search word portions to partitions and virtual subpartitions in a CAM core. Some embodiments of the invention can provide, for example, a hybrid CAM device that includes a mapping circuit for implementing such partitioning and virtual subpartitioning that is implemented in memory, such as a random access memory (RAM) or a combination of CAM and RAM, that is integrated with the CAM core. In some embodiments, a CAM device includes a search word input, a CAM core comprising a plurality of CAM cells, and a virtual partitioning circuit that selectively enables a partition in the CAM core for search of a portion of a search word at the search word input responsive to the search word, and that provides a mapping of the search word to a comparand input to the CAM core. The mapping defines a virtual subpartition in the CAM core. The invention may be embodied as apparatus and methods.

30 Claims, 19 Drawing Sheets

U.S. PATENT DOCUMENTS 6,405,247 B1 6/2002 Lawande et al.
6,418,442 B1 7/2002 Dwyer, III
6,430,074 B1 8/2002 Srinivasan
6,538,911 B1 3/2003 Allan et al.
6,542,391 B2 4/2003 Pereira et al.
6,657,878 B2 * 12/2003 Lien et al. .................... 365/49
6,708,250 B2 * 3/2004 Gillingham ................. 711/108
6,745,280 B2 * 6/2004 Darnell et al. .............. 711/108
2002/0080665 A1 6/2002 Hata
2004/0120174 A1 * 6/2004 Regev et al. ................. 365/49

* cited by examiner

| TIME | C1 | C2 | C3 | C4 |
|---|---|---|---|---|
| 0T TO 0.5T | VSEG 1 & WORD 1 | MASK (0) | WORD 0 | WORD -1 |
| 0.5T TO 1T | VSEG1 & WORD 1 | MASK | WORD 0 | MASK |
| 1T to 1.5T | VSEG1 & WORD 1 | WORD 1 | WORD 0 | WORD 0 |
| 1.5T TO 2T | MASK | WORD 1 | MASK | WORD 0 |
| 2T TO 2.5T | VSEG 2 & WORD 2 | WORD 1 | MASK (1) | WORD 0 |
| 2.5T TO 3T | VSEG 2 & WORD 2 | MASK | MASK (1) | MASK |
| 3T TO 3.5T | VSEG 2 & WORD 2 | WORD 2 | MASK (1) | MASK (1) |
| 3.5T TO 4T | MASK | WORD 2 | MASK | MASK (1) |
| 4T TO 4.5T | VSEG3 & MASK (3) | WORD 2 | MASK (2) | MASK (1) |
| 4.5T TO 5T | VSEG3 & MASK (3) | MASK | MASK (2) | MASK |
| 5T TO 5.5T | VSEG3 & MASK (3) | MASK (3) | MASK (2) | MASK (2) |
| 5.5T TO 6T | MASK | MASK (3) | MASK | MASK (2) |
| 6T TO 6.5T | VSEG4 & WORD 4 | MASK (3) | WORD 3 | MASK (2) |
| 6.5T TO 7T | VSEG4 & WORD 4 | MASK | WORD 3 | MASK |
| 7T TO 7.5T | VSEG4 & WORD 4 | WORD 4 | WORD 3 | WORD 3 |
| 7.5T TO 8T | MASK | WORD 4 | MASK | WORD 3 |
| 8T TO 8.5T | VSEG5 & WORD 5 | WORD 4 | MASK (4) | WORD 3 |
| 8.5T TO 9T | VSEG5 & WORD 5 | MASK | MASK (4) | MASK |
| 9T TO 9.5T | VSEG5 & WORD 5 | WORD 5 | MASK (4) | MASK (4) |
| 9.5T TO 10T | MASK | WORD 5 | MASK | MASK (4) |

FIG. 16

| TIME | C1 | C2 | C3 | C4 |
|---|---|---|---|---|
| 0T TO 0.5T | VSEG1 & WORD 1 | MASK (0) | WORD 0 | WORD -1 |
| 0.5T TO 1T | VSEG1 & WORD 1 | MASK | WORD 0 | MASK |
| 1T to 1.5T | VSEG1 & WORD 1 | MASK (1) | WORD 0 | MASK (0) |
| 1.5T TO 2T | MASK | MASK (1) | MASK | MASK (0) |
| 2T TO 2.5T | VSEG 2 & WORD 2 | MASK (1) | MASK (1) | MASK (0) |
| 2.5T TO 3T | VSEG 2 & WORD 2 | MASK | MASK (1) | MASK |
| 3T TO 3.5T | VSEG 2 & WORD 2 | WORD 2 | MASK (1) | MASK (1) |
| 3.5T TO 4T | MASK | WORD 2 | MASK | MASK (1) |
| 4T TO 4.5T | VSEG3 & MASK (3) | WORD 2 | MASK (2) | MASK (1) |
| 4.5T TO 5T | VSEG3 & MASK (3) | MASK | MASK (2) | MASK |
| 5T TO 5.5T | VSEG3 & MASK (3) | MASK (3) | MASK (2) | MASK (2) |
| 5.5T TO 6T | MASK | MASK (3) | MASK | MASK (2) |
| 6T TO 6.5T | VSEG4 & WORD 4 | MASK (3) | WORD 3 | MASK (2) |
| 6.5T TO 7T | VSEG4 & WORD 4 | MASK | WORD 3 | MASK |
| 7T TO 7.5T | VSEG4 & WORD 4 | MASK (4) | WORD 3 | MASK (3) |
| 7.5T TO 8T | MASK | MASK (4) | MASK | MASK (3) |
| 8T TO 8.5T | VSEG5 & WORD (5) | MASK (4) | MASK (4) | MASK (3) |
| 8.5T TO 9T | VSEG5 & WORD (5) | MASK | MASK (4) | MASK |
| 9T TO 9.5T | VSEG5 & WORD (5) | WORD 5 | MASK (4) | MASK (4) |
| 9.5T TO 10T | MASK | WORD 5 | MASK | MASK (4) |

FIG. 17

CONTENT ADDRESSABLE MEMORY DEVICES WITH VIRTUAL PARTITIONING AND METHODS OF OPERATING THE SAME

BACKGROUND OF THE INVENTION

The present invention relates to associative memory devices and methods, and more particularly, to content addressable memory (CAM) devices capable of partitioned operation and methods of operation thereof.

High-speed, high-volume address lookup operations are a common requirement in data communications applications, such as Internet routing. For example, as channel line rates in core networks increase from OC-48 to OC-768, core routers will generally need to process hundreds of millions of packets per second. This creates the need for very fast searches of Level 2 (L2) & Level 3 (L3) forwarding tables. In Access & Edge networks, the requirement for fast search operations also is significant. While line rates may be lower (e.g., OC-48 and below), increasing "network intelligence" means that each packet typically requires several database searches. This can include operations for packet forwarding, quality of service (QoS) classification, access control and security.

So consequently there is a need for large longest prefix matching (LPM) address forwarding databases that can be quickly searched. For example, new routers may need to support more than 1 million LPM addresses in their databases, but still have to search this database very fast. As line rates go from OC-48 (2.5 Gbps) to OC-768 (10 Gbps), routers may have to perform more than 125M lookups per second.

Hierarchical search algorithms, e.g., "trie" algorithms, implemented in random access memory (RAM) have been used for LPM. For example, in routing applications based on Internet Protocol version 4 (IPv4), a user typically looks at a first portion of an address to index to another node in the search tree. A second portion of the address indexes the entries in this node. The trie algorithm typically repeats until a null entry is reached, returning a best-matched entry as an LPM result.

FIG. 1 illustrates such an algorithm. The portions of an address of overall width W looked up each time are called "strides." Speed and memory storage complexity generally depends on the length k of the strides. More strides generally mean more lookups and, therefore, less lookup speed. However, reduced stride width generally means less memory is required, as nodes can be smaller. Typical stride configurations for IPv4 lookups are 8-8-8-8 and 16-4-4-4-4. Variations, like 16-8-8, are also used. The stride factor defines the memory usage, e.g., for 8-8-8-8, 8 bits of stride require a 256 entry node allocation at each address addition.

Content addressable memory (CAM) is also commonly used for address lookup operations. CAM cells are frequently configured as binary CAM cells that store only data bits (as "1" or "0" logic values) or as ternary CAM (TCAM) cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a TCAM array block having a plurality of entries therein of logical width N, then a compare operation will yield one or more match conditions whenever all the unmasked data bits of an entry in the TCAM array block are identical to the corresponding data bits of the applied search word. This means that if the applied search word equals {1011}, the following entries will result in a match condition in a TCAM: {1011}, {X011}, {1X11}, {10X1}, {101X}, {XX11}, {1XX1}, . . . , {1XXX}, {XXXX}.

CAM is generally well suited for LPM. When a CAM is used for address lookup, entries can be searched in parallel, and a matching entry can be found in one instruction. Address table maintenance in a CAM can also be efficient, as it may take only one write instruction to add one entry to the table, and one instruction to delete an entry to the table.

As fabrication technology improves, bigger and bigger CAMs can be manufactured. However, increasing CAM size can lead to power problems, as a typical CAM pre-charges all of the entries therein for a search. If a device, such as a router, uses multiple CAMs, total power dissipation can be undesirably high.

Techniques for reducing power consumption in large CAM arrays have been proposed. For example, "Reducing TCAM Power Consumption and Increasing Throughput," by Panigrahy et al., *Hot Interconnects* 2002, describes distributing address entries across a plurality of TCAM chips based on prefix ranges of the entries, and using a pruned search technique based on the prefix ranges such that respective chips are searched for addresses having prefixes in respective ranges. In this manner, power consumption can be reduced. Such a prefix mapping can also be used to provide a higher number of lookups for a given prefix range than supported by a single TCAM chip.

U.S. Pat. No. 6,324,087 to Pereira describes a CAM device having a plurality of CAM blocks and partitioned into a number of individually searchable partitions, wherein each partition may include one or more CAM blocks. During compare operations between a comparand word and data stored in the CAM device, a search code is provides to block select circuits, which selectively enable or disable their corresponding CAM blocks. The search code may be provided separate from a comparand word supplied to the CAM blocks, or as part of the comparand word.

U.S. Pat. No. 6,542,391 to Pereira et al. describes a CAM device having a plurality of CAM blocks and a block selection circuit. The block selection circuit includes an input to receive a class code and circuitry to output a plurality of select signals to the plurality of CAM blocks. Each of the select signals selectively disables a respective one of the CAM blocks from participating in a compare operation according to whether the class code matches a class assignment of the CAM block.

U.S. Pat. No. 6,538,911 to Allan et al. describes a CAM with a block select for power management. The CAM device includes a search port that is in communication with a plurality of memory blocks and that is capable of facilitating search operations using the memory blocks. A block select bus is capable of selecting at least one specific memory block, such that search operations are performed using only the selected memory blocks.

SUMMARY OF THE INVENTION

According to various embodiments of the present invention, CAM devices and methods of operating CAM devices include mapping search word portions to partitions and virtual subpartitions in a CAM core. Some embodiments of the invention can provide, for example, a hybrid CAM device that includes a mapping circuit for implementing such partitioning and virtual subpartitioning implemented in memory, such as a random access memory (RAM) or a combination of CAM and RAM, that is integrated with a CAM core. Some embodiments of the invention can provide, for example, a flexible CAM architecture that can be tailored to an address space to provide, for example, a desirable combination of storage density, power consumption, and table maintenance characteristics.

In particular, in some embodiments of the present invention, a CAM device includes a search word input, a CAM core comprising a plurality of CAM cells, and a virtual partitioning circuit that selectively enables a partition in the CAM core for search of a portion of a search word at the search word input responsive to the search word. The virtual partition circuit also provides a mapping of the search word to a comparand input to the CAM core, the mapping defining a virtual subpartition in the CAM core. For example, the virtual partitioning circuit may receive a first portion of the search word and responsively constrain a search for a second portion of the search word to the partition of the CAM core, and the virtual partitioning circuit may generate an additional comparand input for the CAM core corresponding to a virtual subpartition of the partition from the first portion of the search word.

In further embodiments of the present invention, the virtual partitioning circuit comprises a row selection circuit that selects from a plurality of sets of rows of CAM cells in the CAM core responsive to the first portion of the search word, and a column mask circuit that masks columns of the CAM core responsive to first portion of the search word. The column mask circuit may be operative to select among sets of columns of the CAM core for a search responsive to the first portion of the search word. The device may further include respective match line circuits that generate corresponding sets of match line outputs for the sets of columns for respective ones of the rows of CAM cells of the CAM core and an encoder circuit that receives the match line outputs and generates a search result from selected ones of the match line outputs responsive to the first portion of the search word. In other embodiments, the device may include respective match line circuits that generate single match line outputs for respective rows of CAM cells of the CAM core and an encoder circuit that receives the single match line outputs and generates a search result from the single match line outputs. The match line circuits may comprise respective pipelined match line circuits for the respective rows of CAM cells of the CAM core that propagate match indication signals across the sets of columns of the CAM core in a pipelined manner.

According to still further embodiments of the present invention, the virtual partitioning circuit is responsive to a configuration input to define the partitions and subpartitions of the CAM core. For example, the virtual partitioning circuit may be configurable to vary the width of portions of search words that are searched in the CAM core.

According to other aspects of the present invention, a CAM device includes a search word input, a CAM core and a random access memory (RAM). The RAM accesses a memory location therein responsive to a first portion of the search word and controls the CAM core to constrain search for a second portion of the search word to a partition of the CAM core responsive to the accessed memory location. The device may further include a content addressable memory that receives the first portion of the search word and responsively generates an address therefrom. The RAM may receive the address and responsively access the memory location.

BRIEF DESCRIPTION OF THE DRAWINGS

FIGS. 16 and 17 illustrate exemplary search operations according to further embodiments of present invention.

DETAILED DESCRIPTION OF EMBODIMENTS

Figure 1:
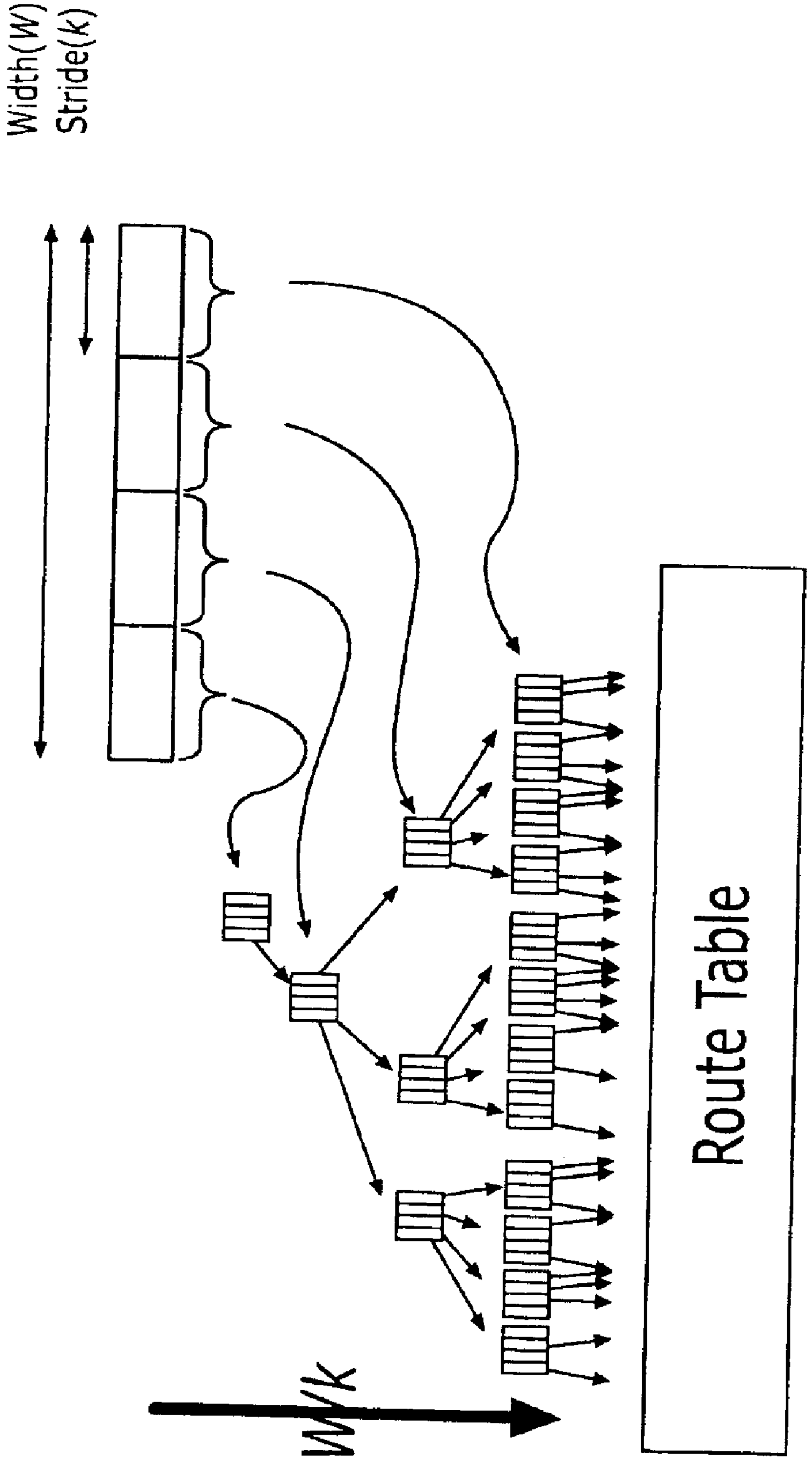
FIG. 1 is a diagram illustrating an exemplary search trie for an address table.

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout.

Overview

Figure 2:
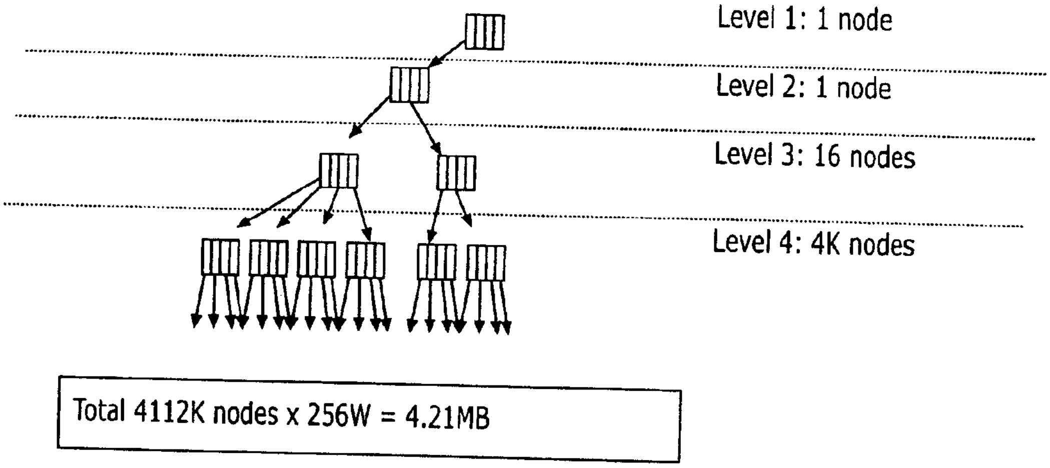
FIGS. 2 and 3 are diagrams illustrating exemplary memory space allocations for a search trie.

Memory storage requirements can be a real problem when attempting to efficiently implement a trie algorithm. In a best case "packed sequential" address distribution, addresses in the address lookup table may be nicely packed into nodes, such that nodes are fully utilized, with very few or no null entries, as illustrated in FIG. 2.

For example, to store 1M IPv4 (Internet Protocol version 4) entries in an 8-8-8-8 trie where all addresses are sequentially distributed, 1M entries will be required at level 4. This translates into 4096 nodes in level 4, 16 in level 3, 1 in level 2 and 1 in level 1. Total memory requirement is around 1M*1/byte=1 Mbyte. In a practical implementation, memory indexing may be W bits at every node (32 bits for IPv4), so total memory requirement is (4K+16)*256(number of pointers per node)*4/byte=4.21 MB.

Figure 3:
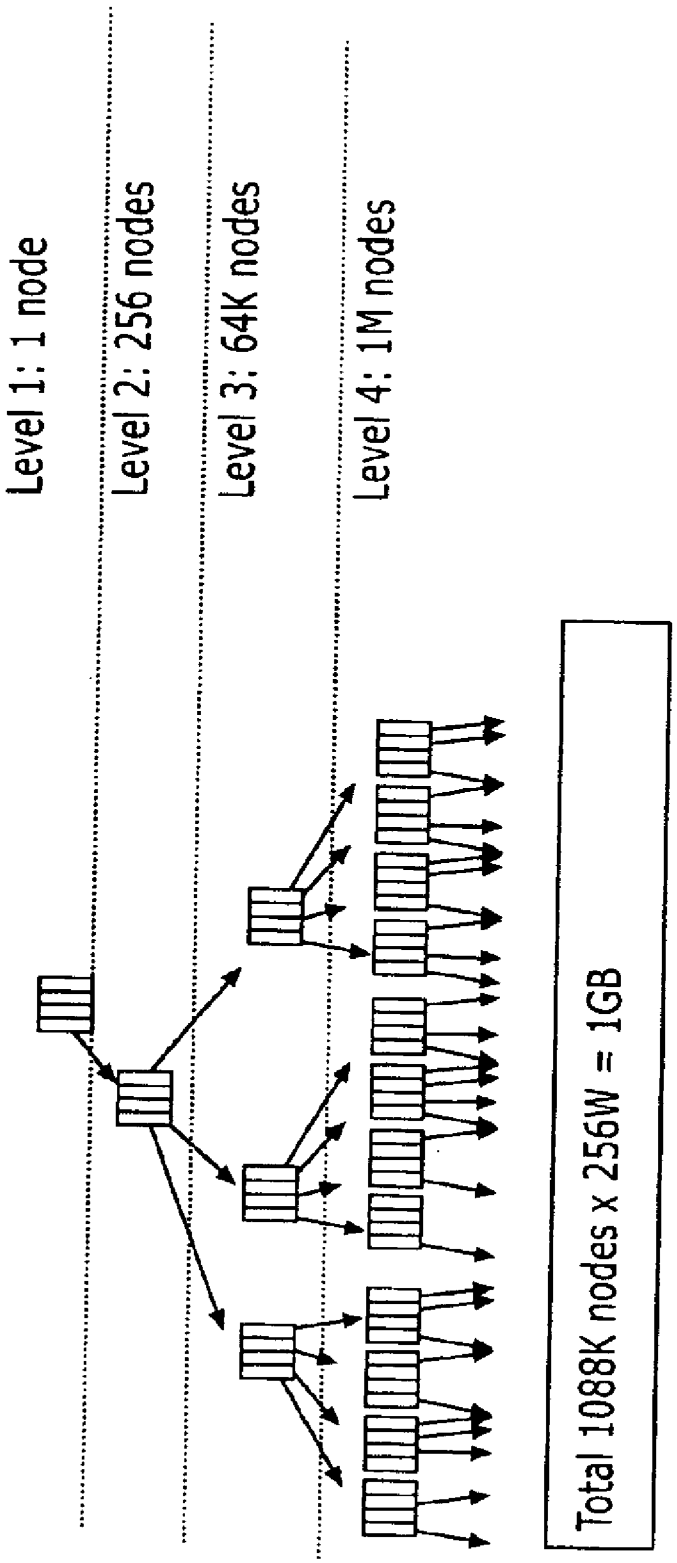

A dramatically larger amount of memory may be required, however, in a worst case "even" address distribution, where all addresses stored in the trie are evenly distributed. This requires a node to be allocated for each address, and all other entries in the node are null. For example, to store 1M IPv4 entries in an 8-8-8-8 trie if all addresses are evenly distributed, 1M nodes will be needed at level 4, as shown in FIG. 3. Each node will have only one entry filled, and all other 255 entries in the node will be null. This translates into 1M nodes in level 4, 1M nodes in level 3, 64k nodes in level 2 and 256 nodes in level 1. The total memory requirement is around (1024K+1024K)*256*1/byte=524 MB. But in a real implementation, with memory indexing of W bits at every node (32 bits for IPv4), the total memory requirement will be (1024K+1024K)*256*4/byte=2 GB. Most of the storage is concentrated in the last level (More than 90%).

Because most of the memory requirement for a trie algorithm typically concentrates on the last levels, memory storage for higher levels can be ignored when estimating memory requirements. A worst-case memory storage requirement for a trie algorithm can be estimated by:

$$\text{Memory cells}=N\times 2^{(k)}\times W$$

(Assuming indexing is W (32 bits for IPv4) at every node) and $$\text{Bus Cycles}=W/k,$$

wherein N is the number of entries, k is the stride factor (8 bits for 8-8-8-8), and W is the address width (32 bits for IPv4). For a comparable CAM type of lookup, the following holds:

$$\text{Memory cells (SRAM equiv)}=N\times 2\times W$$

(Data and Mask are stored separately), and $$\text{Bus cycles}=W/32$$

Figure 4:
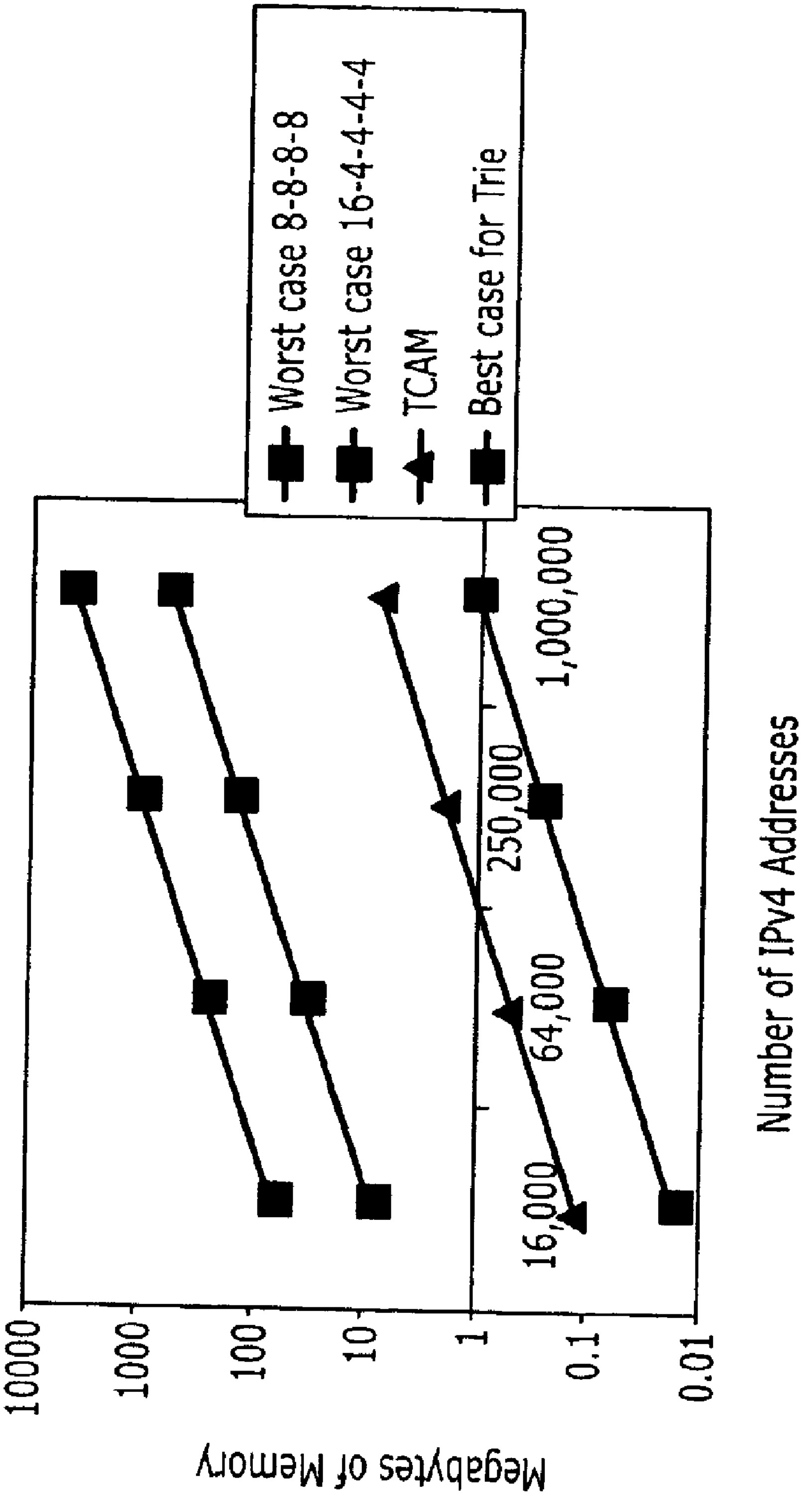
FIGS. 4 and 5 illustrate simulated memory usage for address tables implemented in search tries and content addressable memory.

Results for trie and CAM implementations are plotted in FIG. 4.

Figure 5:
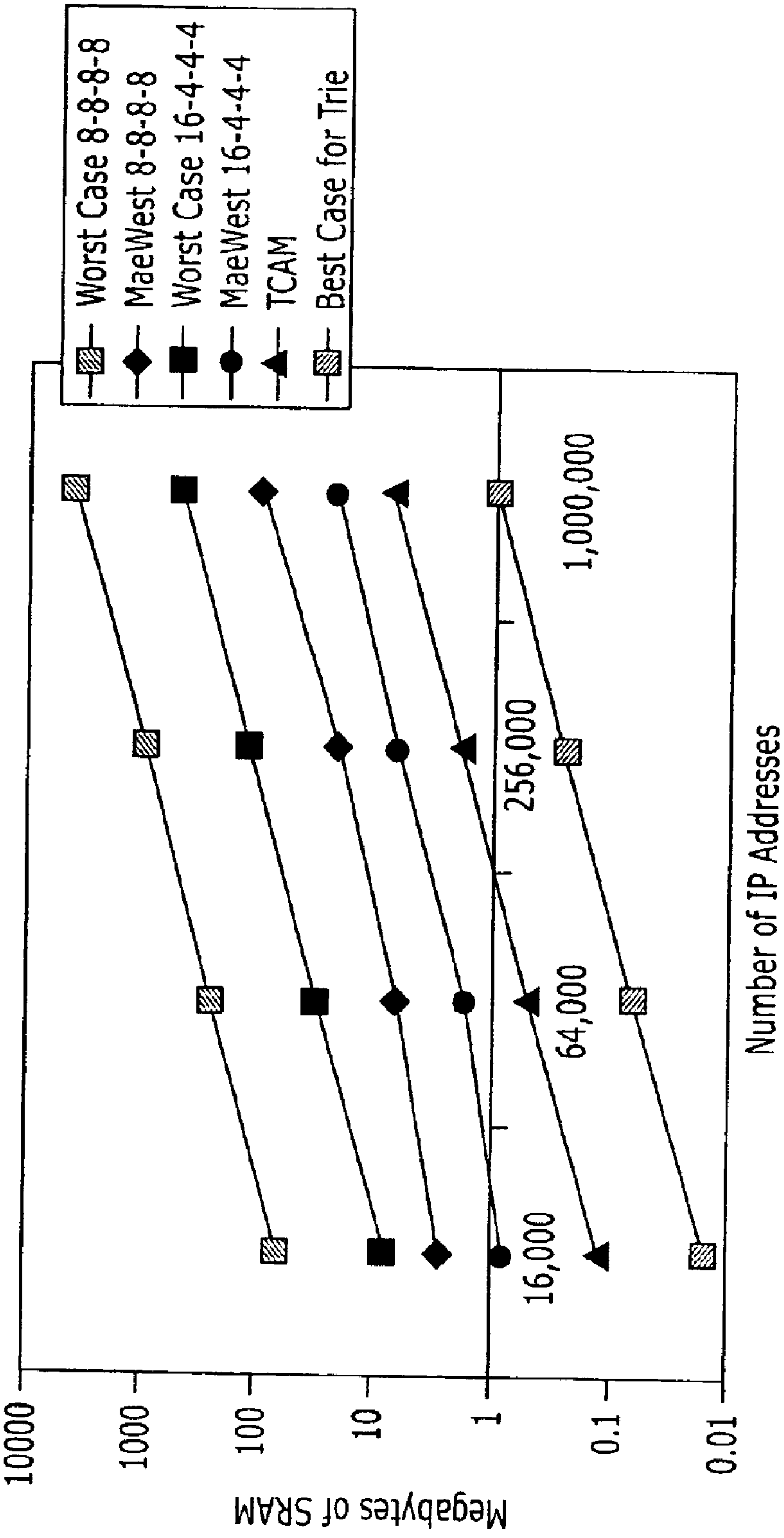

These results can be compared to "real life" problems. An actual Border Gateway Protocol (BGP) table for January 2000 was downloaded, and distinct IPv4 addresses were extracted from that table. A total of 42K distinct entries were extracted and used in simulation. A simulated 1M-entry BGP table from Network Processor Forum is to model bigger Ipv4 tables. The simulated resulting storage requirements for the trie algorithms are shown in FIG. 5.

A jump in memory requirements occurs as more addresses are simulated, because simulated addresses may fall into regions that may require one more node to be allocated, therefore increasing the memory storage requirement significantly. This is illustrated in FIG. 5, which shows worst case and best case memory utilizations for trie algorithms and ternary CAM (TCAM) implementations. TCAM generally requires 20 times less memory for a few number of Ipv4 entries (on the order of 1000–2000), and three to four times less memory for a large number of entries (greater than 1M) than the trie solution.

Another potential problem for a trie algorithm is maintenance. Updating the search table by adding or deleting entries can be a big problem, because the user typically has to traverse the tree to find or delete the suitable entry. For example, when writing a new entry, if stride=k bits, prefix lengths that are not a multiple of k need to be expanded. For example, the following table shows how many write operations may be required for k=2:

| Prefix | Expanded |
|---|---|
| 0* | 00*, 01* |
| 11* | 11* |

The maximum number of expanded prefixes corresponding to one non-expanded prefix=$2^{k-1}$. For example, k=8 may require up to 128 writes for one forward information base (FIB) entry update as a result of one BGP update.

TCAM generally is a desirable architecture in which to implement LPM. TCAM can be viewed as the reverse function of SRAM; when supplied with content, TCAM returns the address of the content. When an address lookup is done, entries can be searched in parallel, and matching entry can be found in one instruction. Maintenance of an address table can also be relatively low in TCAM, as it typically takes only 1 write instruction to add one entry to the table, and 1 instruction to delete an entry.

Some embodiments of the present invention arise from a realization that an address table implemented as a combination of a trie algorithm in a mapping circuit, such as a random access memory (RAM), and a content search in TCAM can provide a desirable mix of memory utilization, maintenance and power consumption. In particular, some embodiments of the present invention address poor memory utilization of the bottom layer of a trie with TCAM. As TCAMs can be an efficient way of storing data in a sparse table, table density (number of entries stored) can be increased by looking up initial strides of the address in memory and using this memory to index different partitions of a TCAM. By using TCAM, support can also be provided for non-address-lookup (e.g., ACL (Access Control List) support). By looking up an initial portion of the address in SRAM, the number of bits looked up in CAM can be decreased and, therefore, more entries can be stored in the TCAM.

Another simulation on a BGP table gives an idea on how many bits can be looked up in SRAM, and how many bits in TCAM:

Out of 42K Mae-West Entries:

- Look up 8 (MSB) bits in SRAM, 24 (LSB) in TCAM
  - 90 out of 256 buckets ($2^8$=256 total buckets) have one or more entry
  - Max. 4246 entries in a bucket
- Look up 16 (MSB) bits in SRAM, 16 (LSB) in TCAM
  - 3780 out of 64K buckets have at least one entry
  - Max. 190 entries in one bucket For a realistic implementation, small buckets are combined into one large bucket. Multiple segments are dedicated for bigger buckets. Buckets can be enabled for lookup separately. By looking up initial number of bits of address in RAM, it is possible to address the memory blowup problem associated with a trie algorithm by looking up the latter bits in an address in CAM.

According to additional aspects of the invention, a partitioning of a CAM array, e.g., using a trie algorithm in RAM to limit search to partitions comprising selected rows and columns of cells, can be augmented by using a "virtual segment" identifier input into a comparand input of the CAM cell array to define virtual subpartitions within these partitions. In this manner, an additional degree of freedom in partitioning the CAM array can be provided, which can allow for a more optimal allocation of address space. According to still further aspects, depth and width of buckets in a partitioned CAM device can be varied based on, for example, changes in the address space that an address table stored in the CAM device is used to represent.

Exemplary Implementations

Figure 6:
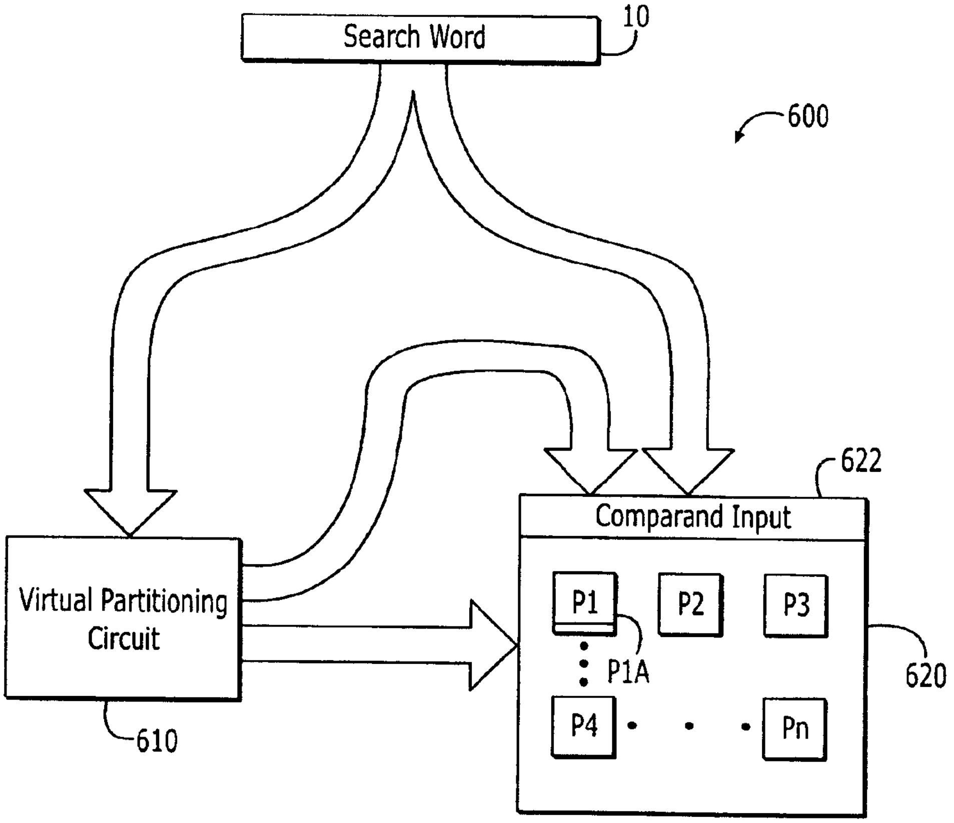
FIG. 6 is a schematic diagram illustrating a CAM device and operations thereof according to some embodiments of the present invention.

FIG. 6 illustrates a content-addressable memory (CAM) device 600 according to some embodiments of the present invention. The CAM device 600 includes a CAM core 620 comprising a plurality of CAM cells and associated circuitry, such as match line, data input, and priority encoder circuitry. The device 600 further includes a virtual partitioning circuit 610 that implements a mapping of a search word 10 (e.g., a portion thereof, such as a prefix) to partitions P1, P2, . . . , Pn of the CAM core 620. The virtual partitioning circuit 610 also provides a mapping of the search word 10 to a comparand input 622 of the CAM core 620, such that at least one virtual subpartition P1A is defined in the partitions P1, P2, . . . , Pn.

It will be appreciated that the CAM device 600 can be implemented, for example, in one or more integrated circuits (ICs). For example, as described in greater detail below, the CAM core 620 may comprise a plurality CAM cells arranged in rows and columns, along with attendant match line, bit line and other circuitry. The virtual partitioning circuit 610 may comprise a lookup table implemented in RAM or other memory, along with attendant logic that provides appropriate control signals to the CAM core 620.

Figure 7:
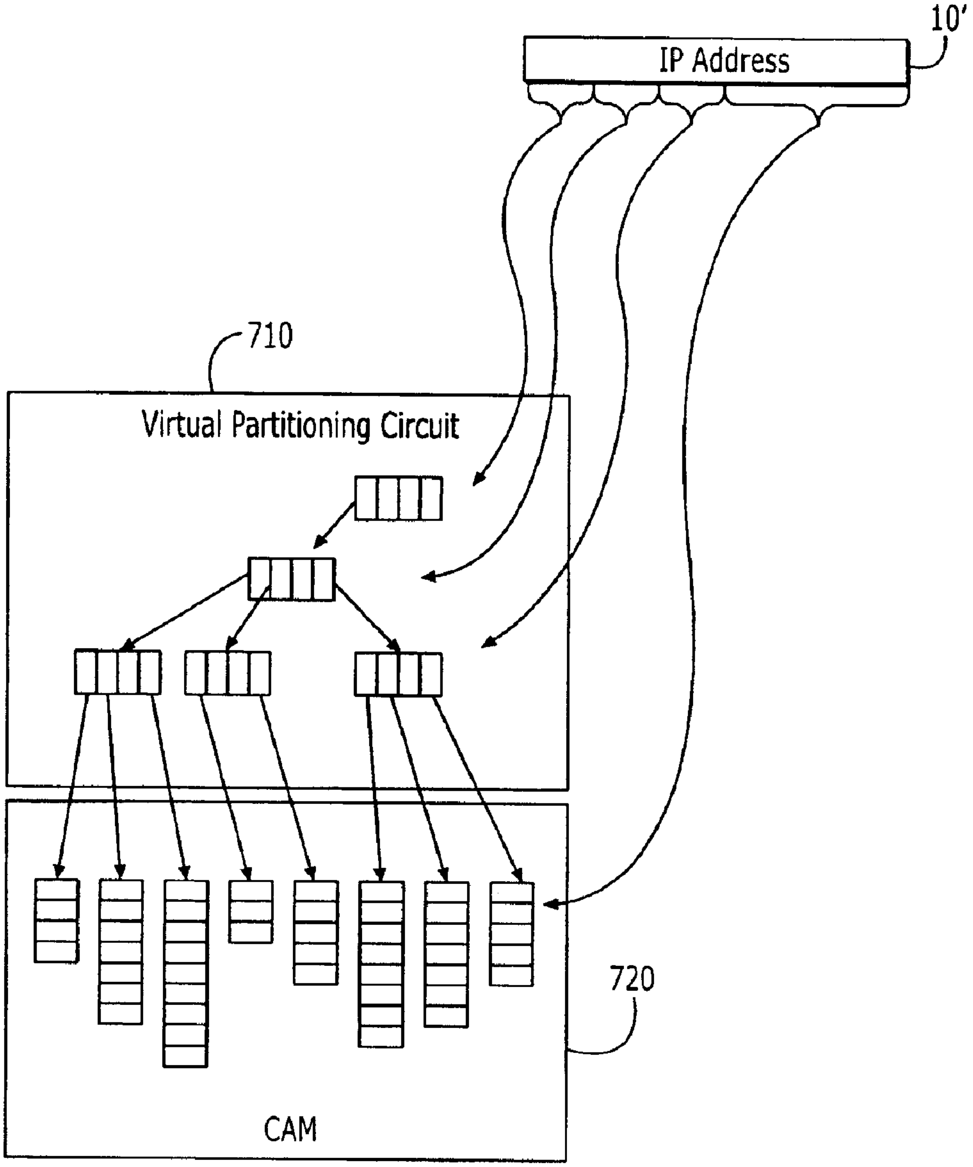
FIG. 7 is a schematic diagram illustrating exemplary implementation of an address table in a CAM device according to further embodiments of the invention.

As described at length below, embodiments of the present invention can provide features in a CAM device that may be particularly advantageous in address table applications. For example, as illustrated in FIG. 7, an address table can be implemented as a search tree (or trie) apportioned to the virtual portioning circuit 710, with a lowest layer implemented in the CAM core 720.

According to some embodiments of the present invention, virtual subpartitioning can provide additional advantages. For example, as noted above, virtual subpartitioning can provide an additional degree of freedom in defining buckets in the CAM device, e.g., can provide additional granularity for a relatively coarse partitioning provided by selecting (e.g., masking) selected rows and/or columns. Reallocation of address space within the CAM array can be achieved by changing the mapping of the virtual subpartitions, without requiring redefinition of the larger partitions.

Figure 8:
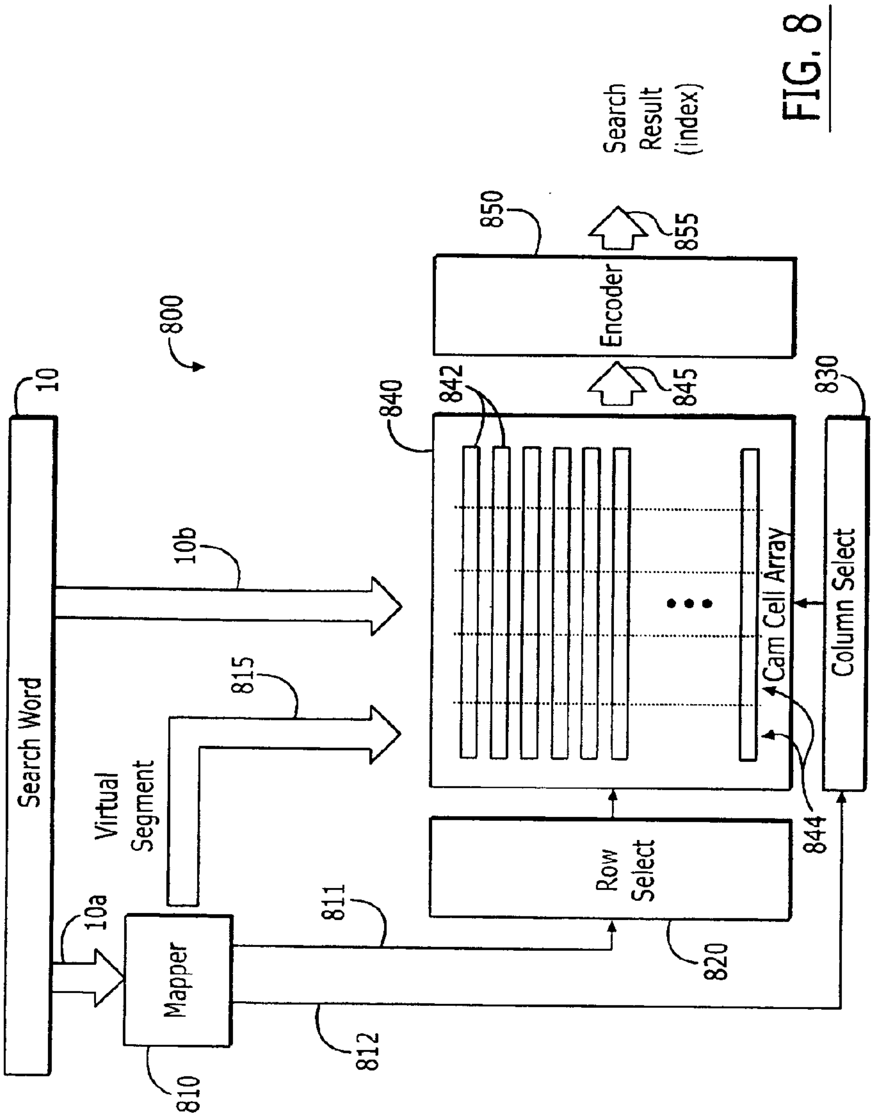
FIGS. 8–12 are diagrams illustrating exemplary partitioning schemes for CAM devices and methods according to some embodiments of the present invention.

FIG. 8 illustrates an exemplary CAM device 800 according to further embodiments of the present invention. The device 800 includes a CAM cell array 840 including a plurality of row sectors 842, i.e., groups of rows of CAM cells that are selectable for search under control of a row select circuit 820. Each of the sectors 840 is further divisible into column segments 844 under control of a column select circuit 830. The row select circuit 820 and the column select circuit 830 are controlled by a mapper circuit 810 that provides a mapping of a first portion 10*a* of a search word 10 to control signals 811, 812 provided to the row select circuit 820 and the column select circuit 830. The mapper circuit 810 further provides a mapping of the first portion 10*b* of the search word 10 to a virtual segment output 815, which is applied as a comparand input to the CAM cell array in conjunction with a second portion 10*b* of the search word 10. Responsive to the signals 811, 812 provided by the mapper circuit 810 to the row select circuit 820 and the column select circuit 830, a columnar segment 844 of a sector 842 is searched for a match to the second portion 10*b*, in concert with a search for a match to the virtual segment output 815. This produces match signals 845 that are applied to an encoder 850 (e.g., a priority encoder), which responsively produces a search result 855 (e.g., an index). As will be described below, such partitioned search operations may occur in a number of different ways. It will be appreciated that the first and second portions 10*a*, 10*b* may not have the particular relationship illustrated in FIG. 1, e.g., the first portion 10*a* (and the second portion 10*b*) could be any contiguous or non-contiguous portion of the search word 10.

Figure 9:
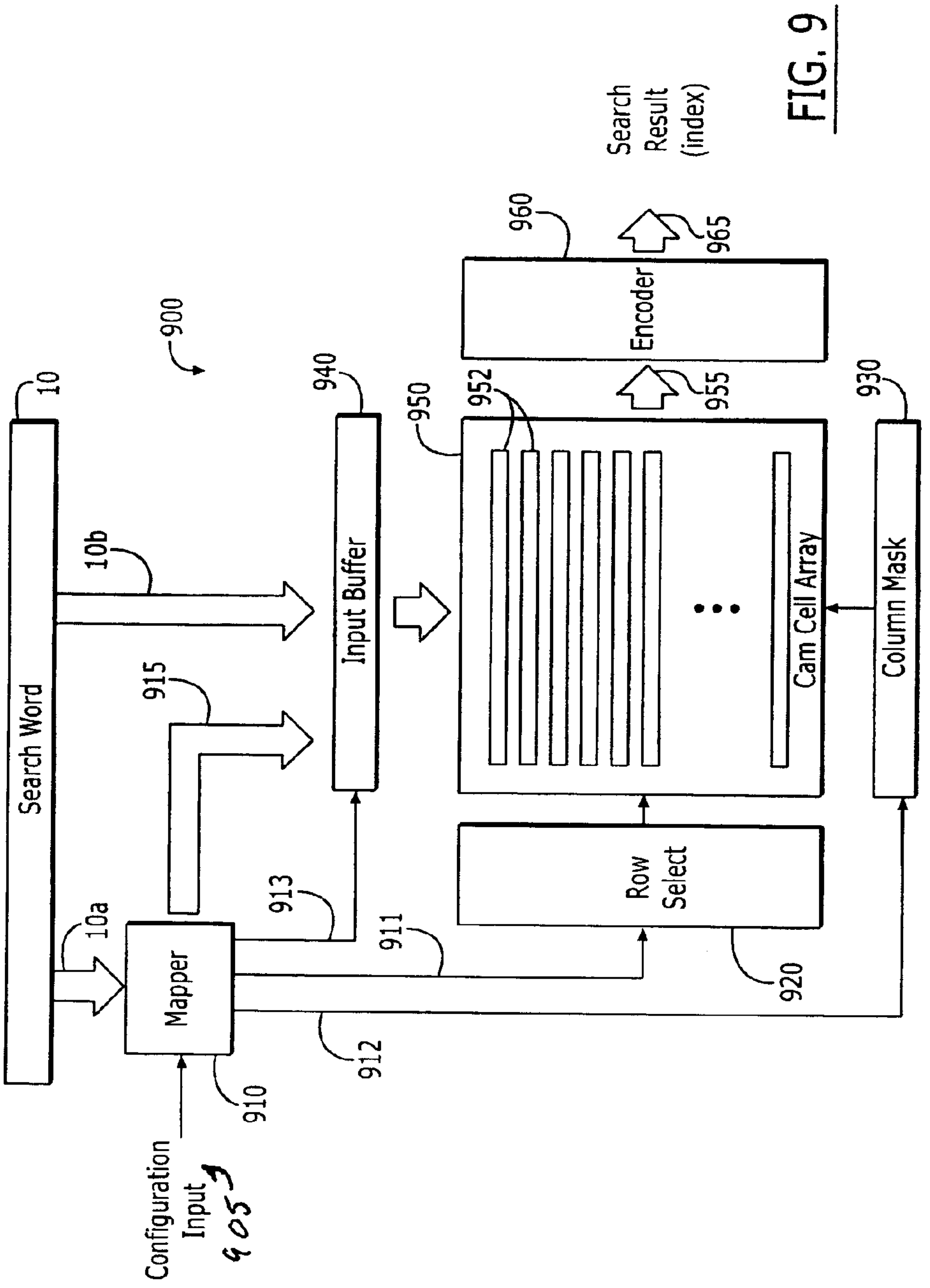

FIG. 9 illustrates an exemplary architecture of a CAM device 900. The device 900 includes a CAM cell array 950 arranged in a plurality of selectable sectors 952 that are selected for search by a row select circuit 920. Columnar segmentation of these sectors 952 may be achieved through use of a mask circuit 930, which masks selected columns of the CAM cell array 950 responsive to a control signal 912 that is generated by a mapper circuit 910 in response to a first portion 10*a* of a search word 10. In particular, the mask circuit 930 may be used to mask out those segments of a selected sector 952 which are not to be searched for a second portion 10*b* of the search word 10. Those skilled in the art will appreciate that the masked cells may use appreciably less power than the cells being searched as, for example, bit lines coupled to these columns need not be precharged for a compare operation. Examples of masking techniques that may be used with the invention are described in a U.S. patent application Ser. No. 10/386,400 entitled "Content Addressable Memory (Cam) Devices Having Dedicated Mask Cell Sub-Arrays Therein and Methods of Operating Same," to Proebsting, filed Mar. 11, 2003.

The device 900 further includes an input buffer 940 that is controlled by a control signal 913 generated by the mapper circuit 910. The input buffer 940 selectively applies comparand inputs for search in the CAM cell array 950. For example, the input buffer 940 may receive a virtual segment signal 915 produced by the mapper circuit 910 and the second portion 10*b* of the search word 10, and may selectively apply the search word portion 10*b* and/or the virtual segment signal 915 to one or more columns of the CAM cell array 950. For example, the CAM cell array 950 may be configured to implement pipelined match determinations to provide match line signals 955 to the encoder 960 to produce search results 965, and the input buffer 940 may be operative to provide search word portions to the CAM cell array 950 in a sequential fashion to implement such pipelined searches. It will be appreciated that the mask circuit 930 may be integrated with the input buffer 940.

The mapper circuit 910, row select circuit 920, mask circuit 930 and input buffer 940 may also be configurable, responsive to a configuration input 905, to vary the manner in which the CAM cell array 950 is partitioned. For example, the width of the columns defined by the mask circuit 930 may be varied, such that the relative widths of the search word portions 10*a* and 10*b* and the virtual segment input 915 can be varied and/or such that the columns to which these various comparands are applied can be varied. Such a configurability feature could be used, for example, to tailor organization of the device to optimally fit the structure of an address table stored in the device 900, e.g., to provide a desired bucket depth and width. Such a capability may also be used, for example, to operate the CAM array 950 in a non-partitioned manner, i.e., such that the entire search word 10 is applied as a comparand to the array 950.

Figure 10:
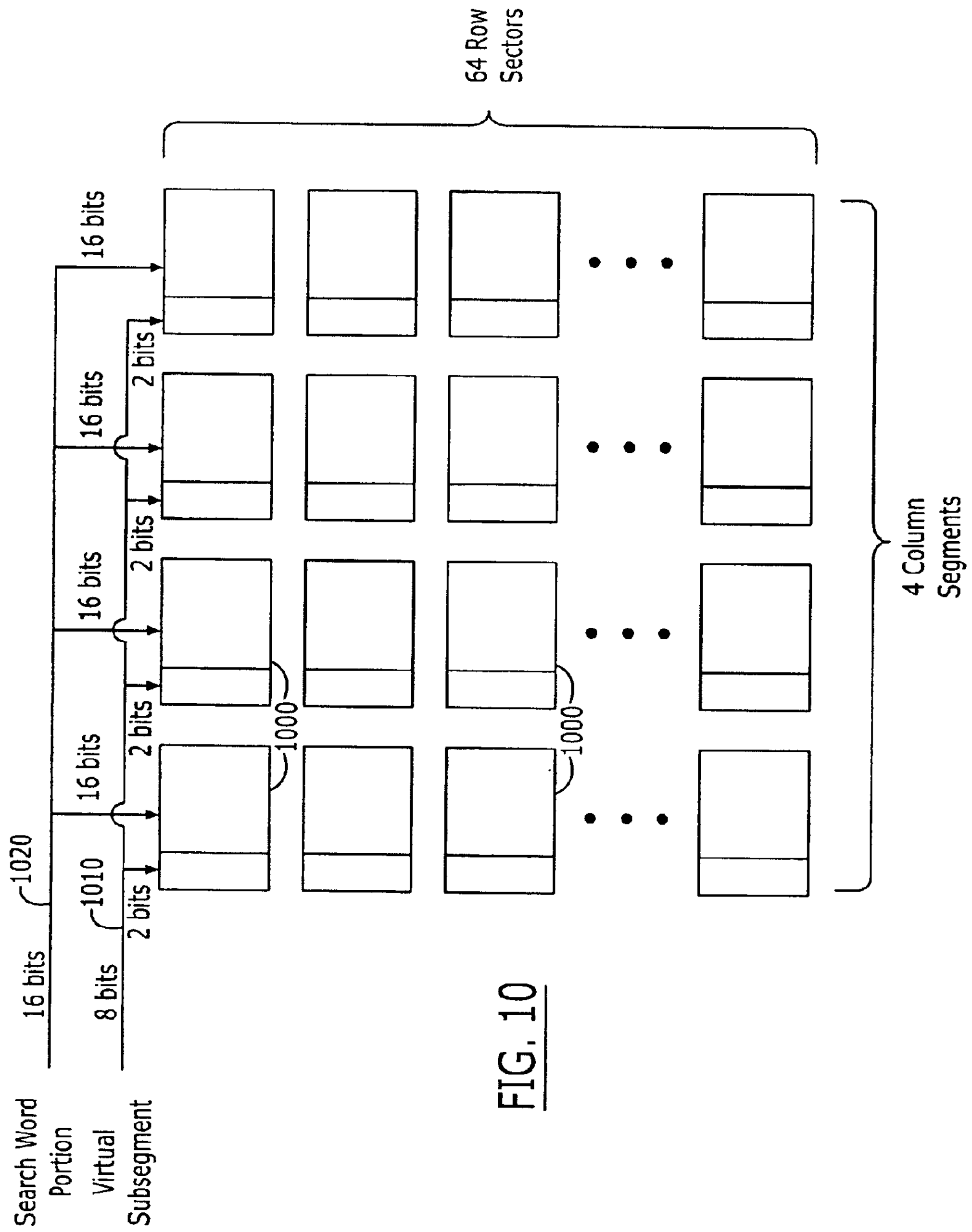

FIG. 10 illustrates an exemplary partitioning scheme for lookup of 32-bit search words in such a device according to some embodiments of the present invention. A 72-bit wide CAM cell array is organized as an array of 256 selectable partitions 1000 defined by 64 row sectors and 4 18-bit column segments. Each of the columns of the partitions 1000 is configured to receive a 16-bit portion 1020 of the 32-bit search word. The partitions 1000 are selected for search based on row/column select signals generated from a second 16-bit portion of the 32-bit search word, e.g., using row sector select and column mask circuitry as described above. As shown, respective ones of the columns of partitions 1000 receive respective 2-bit portions of an 8-bit virtual subsegment input 1010 that is also derived from the second portion of the 32-bit search word. As shown, this allows virtual subpartitioning of each of the partitions 1000 into up to four virtual subpartitions, such that up to 1024 buckets can be provided.

Figure 11:
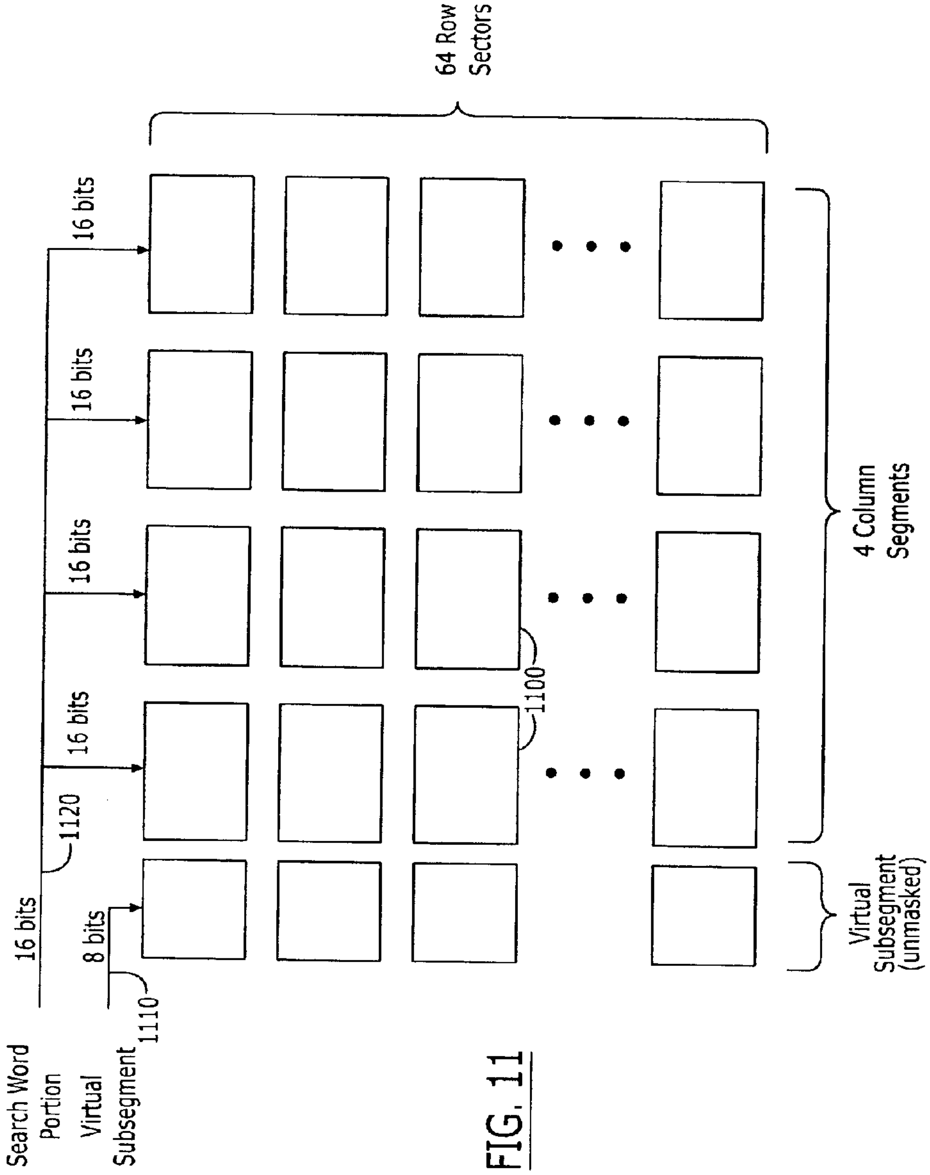

An alternative partitioning scheme is illustrated in FIG. 11. Here, the 72-bit wide CAM cell array is organized as an array of 256 selectable partitions 1100 defined by 64 row sectors and 4 16-bit column segments, along with a separate 8-bit column for virtual segment information. Each of the columns of the partitions 1100 is configured to receive a first 16-bit portion 720 of a 32-bit search word. The partitions 1100 are selected based on row/column select signals generated from a 16-bit second portion of the 32-bit search word. As shown, respective ones of the columns of partitions 1100 are searched in conjunction with searching for the 8-bit virtual subsegment input 1110 in the leftmost column, thereby allowing provision of up to 64K buckets. Although such a configuration includes a constraint that buckets in the same row must have the same virtual subsegment number, which can cause decreased flexibility in choosing bucket numbers, this configuration can be relatively easily modified to handle 32-bit or 64-bit searches, i.e., the columns can be combined to increase the width of the portion of the search word searched in the array.

Figure 12:
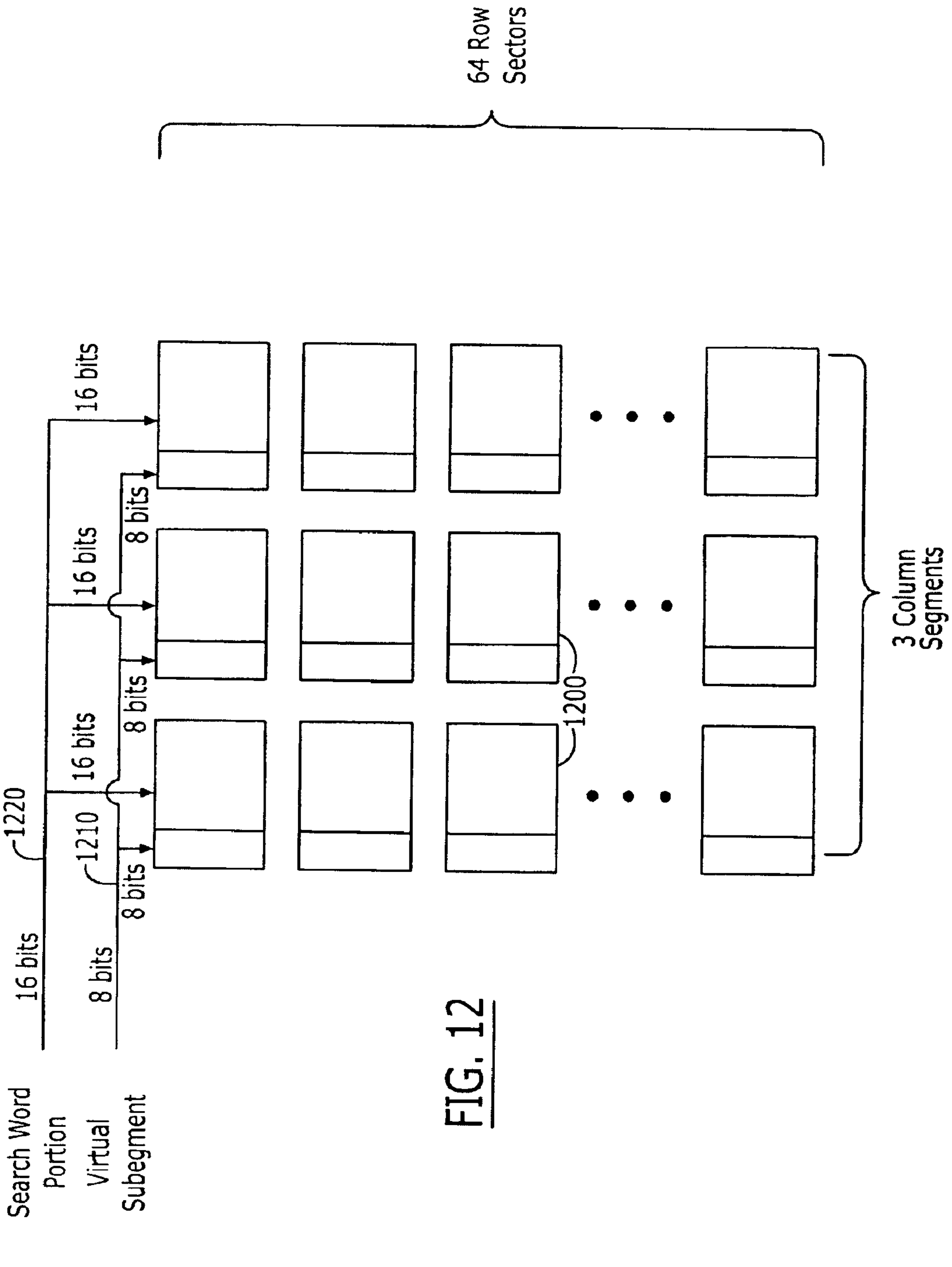

Yet another alternative partitioning scheme is illustrated in FIG. 12. The 72-bit wide CAM cell array comprises an array of 192 selectable partitions 1200 defined by 64 row sectors and 3 24-bit column segments. Each of the columns of the partitions 1200 is configured to receive a first 16-bit portion 1220 of the 32-bit search word. The partitions 1200 are selected based on row/column select signals generated from a second 16-bit portion of the 32-bit search word. As shown, each of the columns of partitions 1200 receives an 8-bit virtual subsegment input 1210 that is also derived from the second portion of the 32-bit search word. This allows virtual subpartitioning of each of the partitions 1200 into up to 256 virtual subpartitions, such that up to 48K buckets can be provided.

It will be appreciated that the partitioning schemes illustrated in FIGS. 10–12 are provided for purposes of illustrations, and that other partitioning schemes fall within the scope of the present invention. It will be further appreciated that, according to some embodiments of the present invention, a CAM device can be configurable to utilize various different partitioning schemes, such as those illustrated in FIGS. 10–12. For example, referring to FIG. 9, the mapper circuit 910, input buffer 940, column mask circuit 930, and CAM cell array 950 of the CAM device 900 could be configurable to implement any or all of the partitioning schemes illustrated in FIGS. 10–12.

Figure 13:
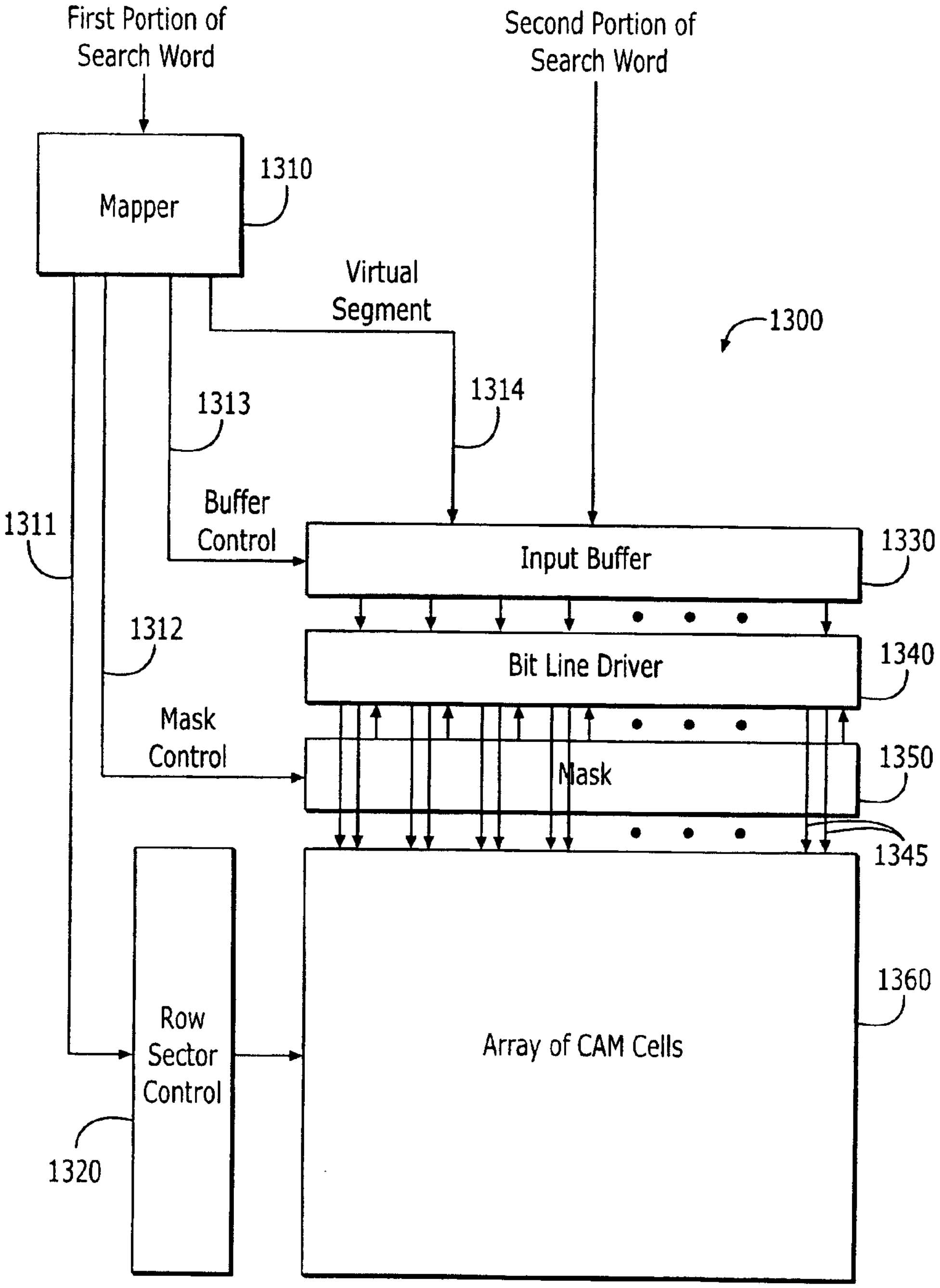
FIG. 13 is a schematic diagram illustrating an exemplary configuration of a CAM device and operations thereof according to further embodiments of the present invention.

FIG. 13 illustrates a CAM device 1300 according to still further embodiments of the present invention. The CAM device 1300 includes a mapper circuit 1310 that maps a first portion of a search word (e.g., a prefix of an IP address) to control signals 1311 and 1312 that are applied to a sector control circuit 1320 and a mask circuit 1350. An input buffer 1330 is configured to receive a second portion of the search word, along with a virtual segment input 1314 from the mapper circuit 1310, and applies these to a bit line driver circuit 1340 responsive to a control signal 1313. The bit line driver circuit 1340 controls bit lines 1345 that are provided to a CAM cell array 1360, and can provide a masking effect by driving selected ones of the bit lines 1345 responsive to control signals generated by the mask circuit 1350. An example of such a bit line/mask architecture is described in the aforementioned U.S. patent application Ser. No. 10/386,400 entitled "Content Addressable Memory (Cam) Devices Having Dedicated Mask Cell Sub-Arrays Therein and Methods of Operating Same," to Proebsting, filed Mar. 11, 2003.

Figure 14:
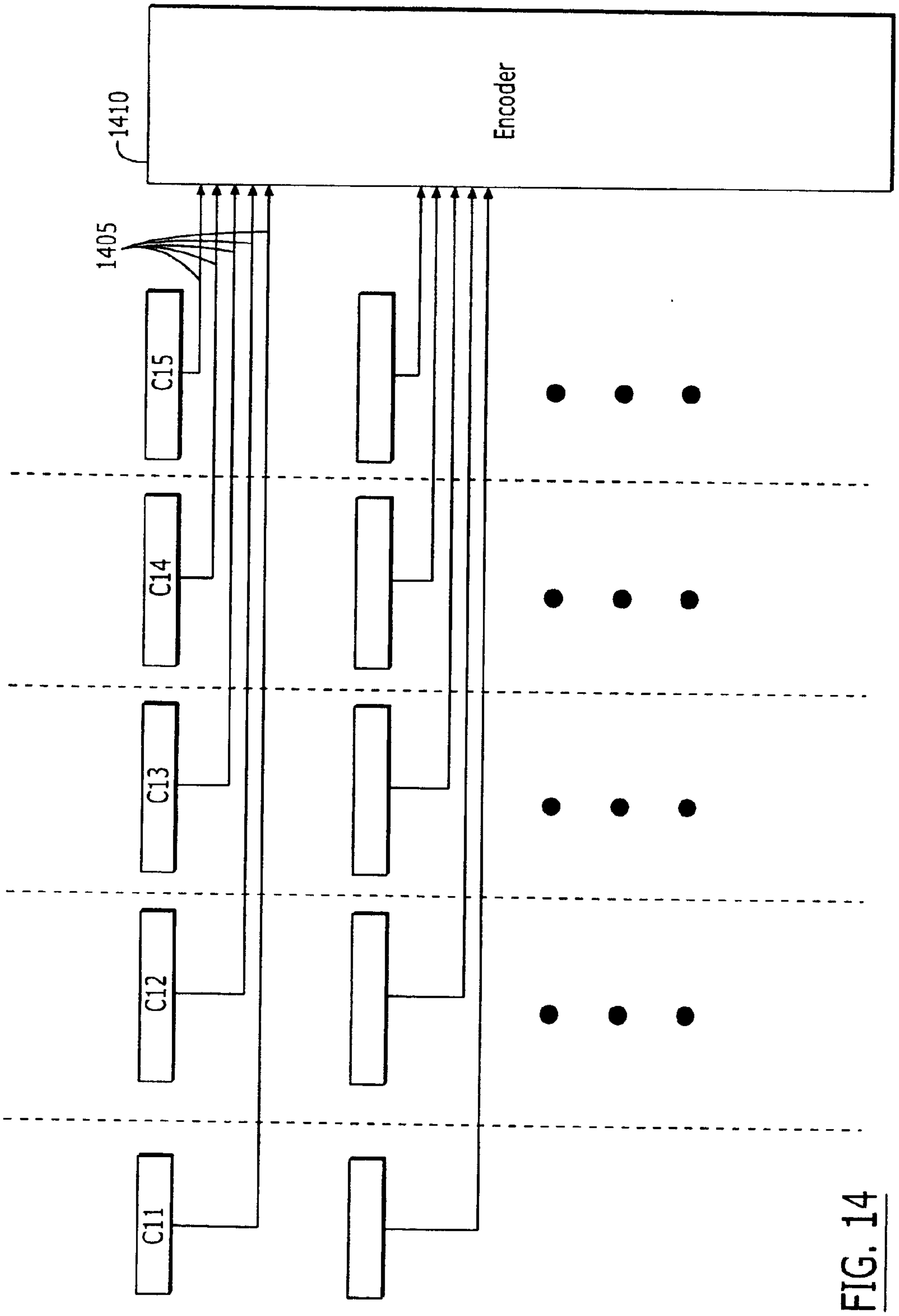
FIGS. 14 and 15 illustrate various match line circuit configurations that may be used in further embodiments of the present invention.
Figure 15:
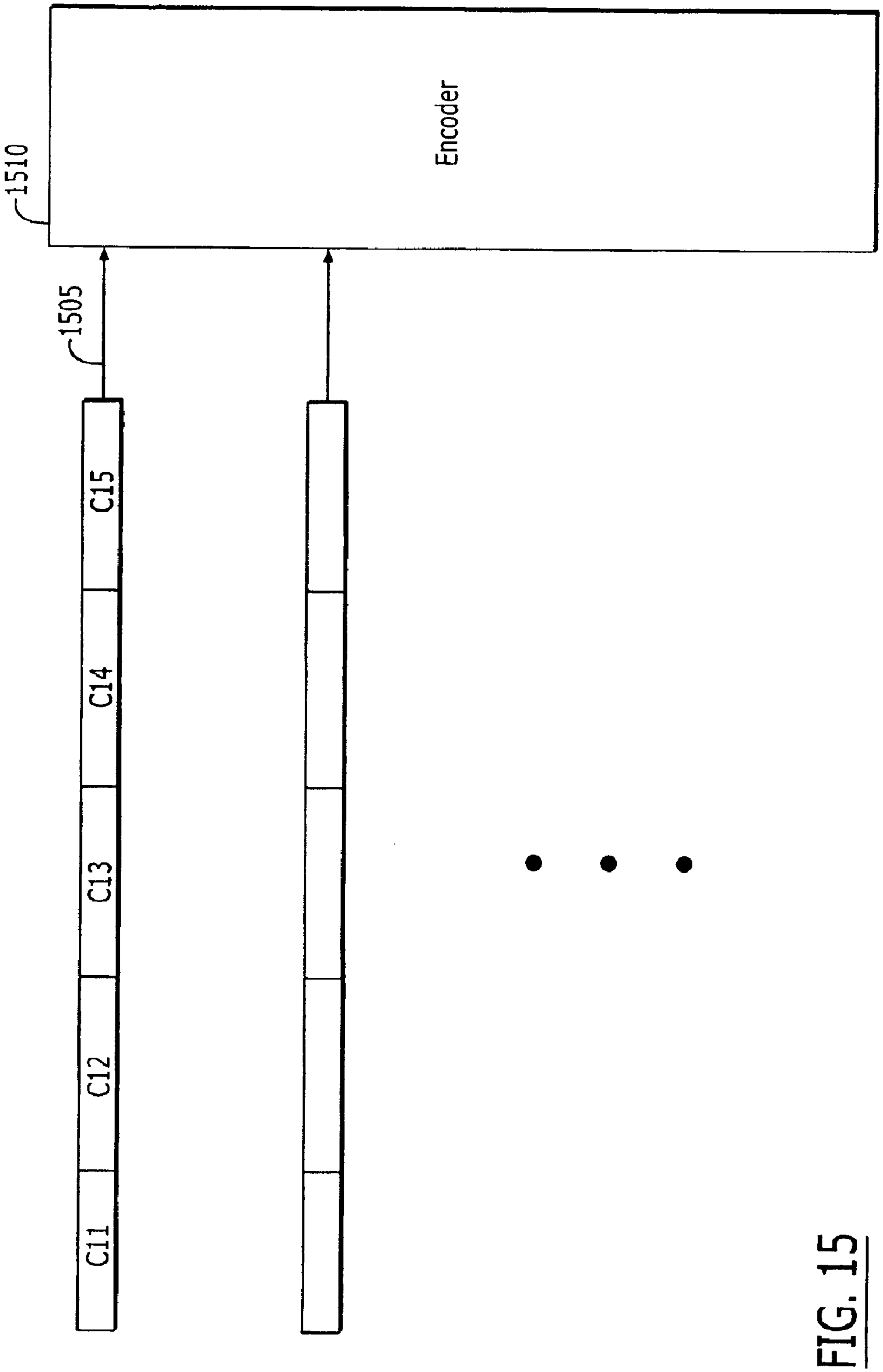

The CAM cell array 1360 may include match line circuitry having any number of different configurations. For example, the array 1360 may have a fixed segmentation as illustrated in FIG. 14, in which segments C11–C15 of a row of CAM cells provide respective match line outputs 1405 to a priority encoder 1410, which may be configured to select among the match lines 1405 depending on which of the segments C11–C15 is being searched. Alternatively, the array 1360 may have a match line architecture such as illustrated in FIG. 15, in which a single match line 1505 is provided to an encoder 1510 for a row of cells organized into segments C11–C15. For example, the CAM cell array 1360 may utilize a ripple-type or latched match line architecture in which match line outputs are propagated along a row of CAM cells to a priority encoder.

FIG. 16 is a table illustrating exemplary operations in which 32-bit search word portions can be searched in a pipelined fashion in such a CAM device according to further embodiments of the present invention. In particular, the table illustrates bit line states for respective columns C1, C2, C3, C4 at various times. Search word portions WORD0, WORD1, . . . , WORD5 are input to the four columns C2, C3, C4, and a combination of the search word portions WORD0, WORD1, . . . , WORD5 and corresponding virtual segment inputs VSEG1, VSEG2, . . . , VSEG5 are applied to the first column C1. As shown, there is a delay of 1 clock cycle T between the columns C1, C2, C3, C4. For example, during an interval 0T to 1T, the bit lines of column 1 are driven with VSEG1 & WORD1, producing a match result that is propagated through columns C2, C3 and C4 by masked cycles MASK(1) during the time interval 1T to 3T. Similarly, during a time interval 2T to 3T, bit lines of column C1 are driven with a combination of VSEG2 and a MASK (2), producing a match result that is carried to column C2 at time T3, at which time corresponding search word portion WORD2 appears in column C2. This produces an updated match result that is then propagated through columns C3 and C4 by masks MASK(2). Complete search results appear at column 4 coincident with the various masks MASK(1), MASK(2), . . . , MASK(5) corresponding to the search word portions WORD0, WORD1, . . . , WORD5. FIG. 17 is a similar table illustrating exemplary operations in which the search word portions are decreased to a 16-bit width.

Figure 18:
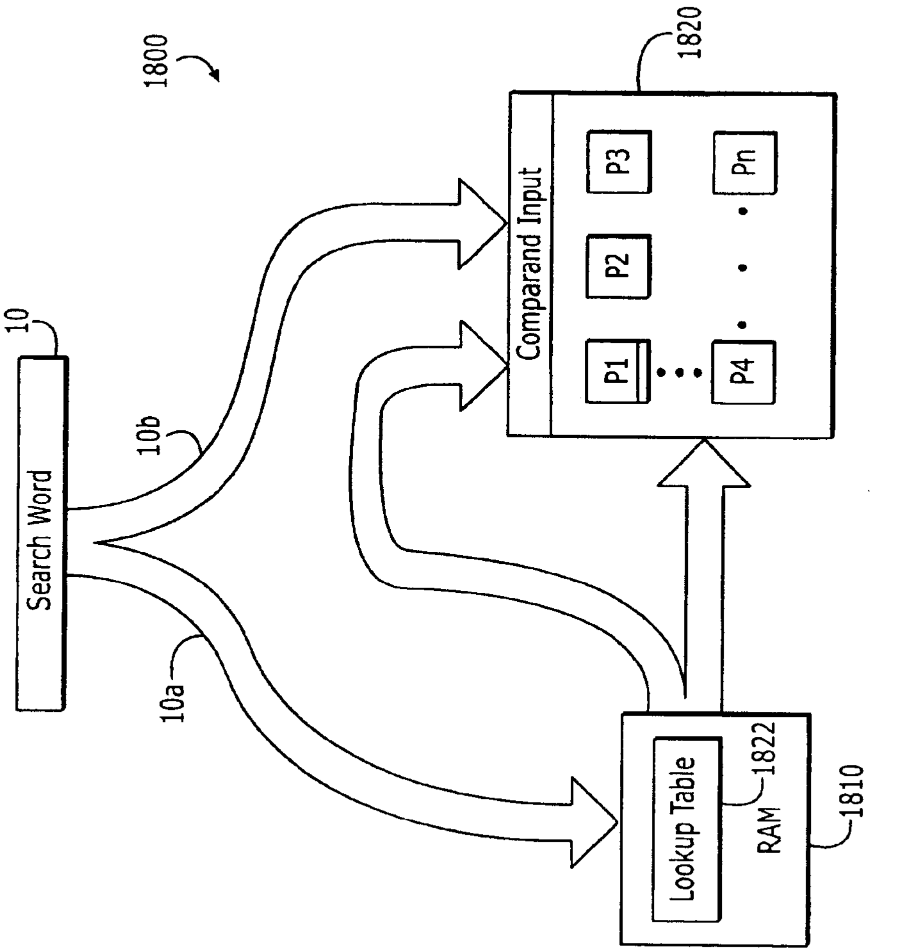
FIGS. 18 and 19 are schematic diagrams illustrating exemplary implementations of CAM devices according to some embodiments of the present invention.
Figure 19:
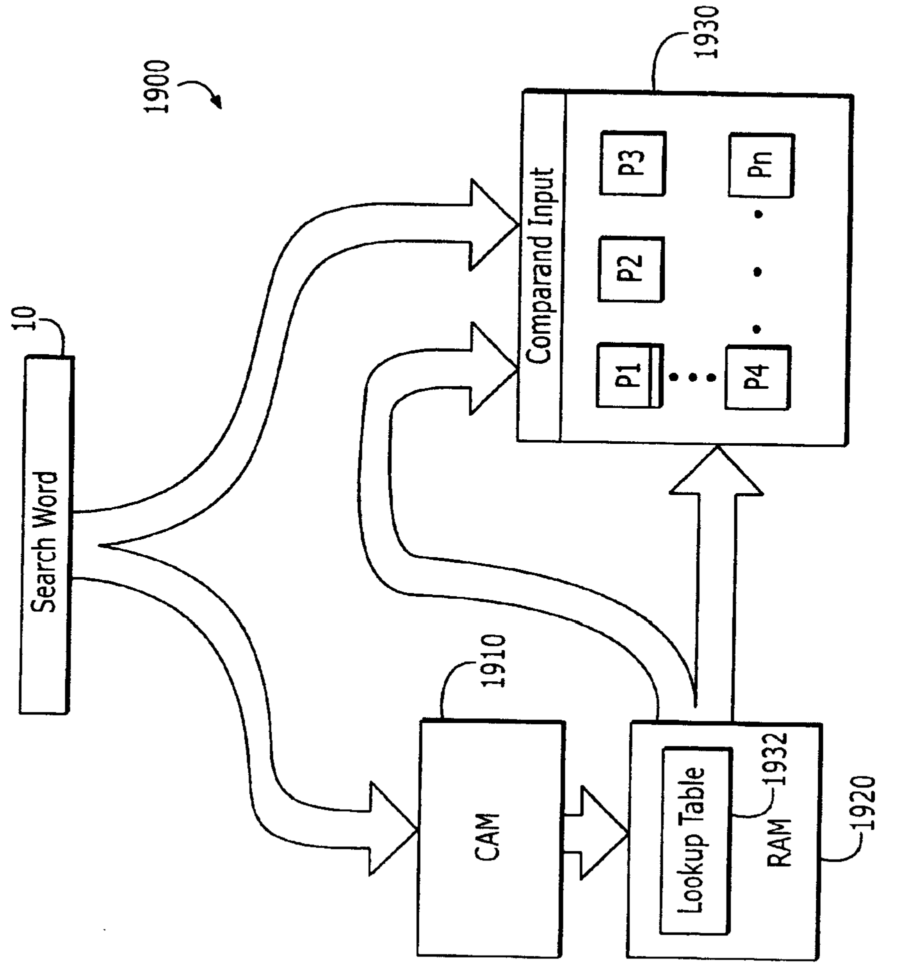

FIGS. 18 and 19 illustrate exemplary implementations of a CAM device according to further embodiments of the present invention. Referring to FIG. 18, a CAM device 1800 includes a virtual partitioning circuit implemented as a lookup table 1822 in a RAM 1810. A first portion 10*a* of a search word 10 is applied to an address input of the RAM 1810. A first portion of the output of the RAM 1810 is provided as control signals for selecting from among partitions P1, P2, . . . , Pn of a CAM core 1820. A second portion of the output of the RAM 1810 is provided as a comparand input to the CAM core 1520, along with a second portion 10*b* of the search word 10. The lookup table 1822 provides a mapping of the first search word portion 10*b* to virtual subpartitions defined within the partitions P1, P2, . . . , Pn. FIG. 19 illustrates an alternative implementation of a CAM device 1900, in which a partition mapping function is provided by a combination of a CAM 1910 and a RAM 1920.

This latter configuration can provide advantages over the configuration of FIG. 18. This architecture can be much more flexible, as the width of the first search word portion 10*a* can be increased or decreased more easily. The number of buckets in CAM can also be more easily adjusted. Updating address information in such a combination of CAM and RAM can also be simpler, because a prefix write to TCAM typically requires only one write instruction, instead of multiple writes.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A content addressable memory (CAM) device, comprising:

a search word input;

a CAM core comprising a plurality of CAM cells; and a virtual partitioning circuit that selectively enables a partition in the CAM core for search of a portion of a search word at the search word input responsive to the search word, and that provides a mapping of the search word to a comparand input to the CAM core, the mapping defining a virtual subpartition.

2. A CAM device according to claim 1, wherein the virtual partitioning circuit receives a first portion of the search word and responsively constrains search for a second portion of the search word to the partition of the CAM core, and wherein the virtual partitioning circuit generates a comparand input corresponding to a virtual subpartition of the partition from the first portion of the search word.

3. A CAM device according to claim 2, wherein the virtual partitioning circuit masks selected cells of the CAM core responsive to the first portion of the search word.

4. A CAM device according to claim 3, wherein the virtual partitioning circuit comprises a column mask control circuit that masks selected columns of the CAM core responsive to the first portion of the search word.

5. A CAM device according to claim 2, wherein the virtual partitioning circuit enables search of selected rows of CAM cells of the CAM core responsive to the first portion of the search word.

6. A CAM device according to claim 2, wherein the virtual partitioning circuit comprises:

a row selection circuit that selects from a plurality of sets of rows of CAM cells in the CAM core responsive to the first portion of the search word; and a column mask circuit that masks columns of the CAM core responsive to first portion of the search word.

7. A CAM device according to claim 6, wherein the column mask circuit is operative to select among sets of columns of the CAM core for search responsive to the first portion of the search word, and further comprising:

respective match line circuits that generate corresponding sets of match line outputs for the sets of columns for respective ones of the rows of CAM cells of the CAM core; and an encoder circuit that receives the match line outputs and generates a search result from selected ones of the match line outputs responsive to the first portion of the search word.

8. A CAM device according to claim 6, wherein the column mask circuit is operative to select among sets of columns of the CAM core for search responsive to the first portion of the search word, and further comprising:

respective match line circuits that generate single match line outputs for respective rows of CAM cells of the CAM core; and an encoder circuit that receives the single match line outputs and generates a search result from the single match line outputs.

9. A CAM device according to claim 8, wherein the match line circuits comprise respective pipelined match line circuits for the respective rows of CAM cells of the CAM core that propagate match indication signals across the sets of columns of the CAM core in a pipelined manner.

10. A CAM device according to claim 9, wherein the virtual partitioning circuit comprises:

a mapper circuit that receives first portions of search words at the search word input and sequentially selects sets of rows, masks sets of columns, and applies virtual subpartition comparand inputs to the comparand input of the CAM core responsive to the first portions of the search words; and an input buffer circuit that receives second portions of the search words and sequentially applies the second portions of the search words to the comparand input of the CAM core, wherein operations of the mapper circuit, the input buffer circuit, the pipelined match line circuits and the encoder circuit are coordinated to sequentially produce respective search results for respective ones of the search words from the encoder circuit.

11. A CAM device according to claim 2, wherein the first and second portions of the search word are mutually exclusive sets of bits.

12. A CAM device according to claim 1, wherein the virtual partitioning circuit is responsive to a configuration input to define the partitions and subpartitions of the CAM core.

13. A CAM device according to claim 12, wherein the virtual partitioning circuit selectively enables partitions in the CAM core for search of portions of search words at the search word input responsive to the search word and provides a mapping of the search words to comparand inputs to the CAM core; and wherein the virtual partitioning circuit is further configurable to vary the width of the portions of the search words that are searched in the CAM core.

14. A CAM device according to claim 1, wherein the virtual partitioning circuit comprises a lookup table.

15. A CAM device according to claim 14, wherein the lookup table is implemented in at least one of a CAM and a RAM.

16. A content addressable memory (CAM) device, comprising:

a search word input configured to receive a search word;

a CAM core;

a random access memory (RAM) that accesses a memory location therein responsive to a first portion of the search word and that applies a control input to the CAM core to constrain search for a second portion of the search word to a partition of the CAM core responsive to the accessed memory location.

17. A CAM device according to claim 16, further comprising a content addressable memory that receives the first portion of the search word and responsively generates an address therefrom, and wherein the RAM receives the address and responsively accesses the memory location.

18. A content addressable memory (CAM) device, comprising:

a search word input;

a CAM core comprising a plurality of CAM cells;

means for selectively enabling a partition in the CAM core for search of a portion of a search word at the search word input responsive to the search word;

means for mapping the search word to a virtual subpartition identifier and for providing the virtual subpartition identifier as a comparand input to the CAM core.

19. A CAM device according to claim 18, wherein the means for selectively enabling a partition of the CAM core for search comprises means for receiving a first portion of the search word and for responsively constraining search for a second portion of the search word to the partition of the CAM core, and wherein the means for mapping the search word to virtual subpartitioning identifier comprises means for generating the virtual subpartition identifier from the first portion of the search word.

20. A method of operating a content addressable memory (CAM) device, the method comprising:

receiving a search word;

selectively enabling a partition in a CAM core for search of a portion of the search word at the search word input responsive to the search word;

mapping the search word to a virtual subpartition identifier; and searching the partition for the portion of the search word in conjunction with searching the CAM core for the virtual subpartition identifier to thereby produce a search result for the search word.

21. A method according to claim 20:

wherein selectively enabling a partition in a CAM core for search of a portion of the search word at the search word input responsive to the search word comprises selectively enabling the partition for search responsive to a first portion of the search word;

wherein mapping the search word to a virtual subpartition identifier comprises mapping the first portion of the search word to the virtual subpartition identifier; and wherein searching the enabled partition for the portion of the search word in conjunction with searching the CAM core for the virtual subpartition identifier to thereby produce a search result for the search word comprises searching the enabled partition for a second portion of the search word in conjunction with searching the CAM core for the virtual subpartition identifier to thereby produce the search result for the search word.

22. A method according to claim 21, wherein selectively enabling the partition for search responsive to a first portion of the search word comprises masking selected cells of the CAM core responsive to the first portion of the search word.

23. A method according to claim 21, wherein selectively enabling the partition for search responsive to a first portion of the search word comprises enabling search of selected rows of the CAM core responsive to the first portion of the search word.

24. A method according to claim 21, wherein selectively enabling the partition for search responsive to a first portion of the search word comprises:

selecting from a plurality of sets of rows of CAM cells in the CAM core responsive to the first portion of the search word; and masking columns of the CAM core responsive to first portion of the search word.

25. A method according to claim 24, wherein masking columns of the CAM core responsive to first portion of the search word comprises selecting among sets of columns of the CAM core for search responsive to the first portion of the search word, and further comprising:

generating corresponding sets of match line outputs for the sets of columns for respective ones of the rows of CAM cells of the CAM core; and generating a search result from selected ones of the match line outputs responsive to the first portion of the search word.

26. A method according to claim 24, wherein masking columns of the CAM core responsive to first portion of the search word comprises selecting among sets of columns of the CAM core for search responsive to the first portion of the search word, and further comprising:

generating single match line outputs for respective rows of CAM cells of the CAM core; and generating a search result from the single match line outputs.

27. A method according to claim 26, further comprising propagating match indication signals across the sets of columns of the CAM core in a pipelined manner.

28. A method according to claim 21, wherein the first and second portions of the search word are mutually exclusive sets of bits.

29. A method of operating a content addressable memory (CAM) device, the method comprising:

receiving a search word;

accessing a memory location in a random access memory (RAM) responsive to a first portion of the search word; and constraining search for a second portion of the search word to a partition of the CAM core responsive to the accessed memory location.

30. A method according to claim 29, further comprising receiving the first portion of the search word at a comparand input of a CAM and responsively generating an address therefrom, and wherein accessing a memory location comprises accessing the memory location responsive to the generated address.

* * * * *